United States Patent
Kawai

(10) Patent No.: US 9,559,401 B2
(45) Date of Patent: Jan. 31, 2017

(54) PRINTED BOARD AND WIRING ARRANGEMENT METHOD

(71) Applicant: FUJITSU LIMITED, Kawasaki-shi, Kanagawa (JP)

(72) Inventor: Kenichi Kawai, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 93 days.

(21) Appl. No.: 14/573,605

(22) Filed: Dec. 17, 2014

(65) Prior Publication Data

US 2015/0214596 A1   Jul. 30, 2015

(30) Foreign Application Priority Data

Jan. 24, 2014 (JP) ................. 2014-011480

(51) Int. Cl.
*H01P 3/08* (2006.01)
*H05K 1/02* (2006.01)
*H01P 3/02* (2006.01)

(52) U.S. Cl.
CPC ............. *H01P 3/026* (2013.01); *H05K 1/0248* (2013.01); *Y10T 29/49117* (2015.01)

(58) Field of Classification Search
CPC .... H05K 1/0245; H05K 1/0248; H05K 1/025; H05K 2201/09263; H05K 2201/09272; H01P 3/081
USPC .................... 333/4, 24 R, 156, 161; 174/250
See application file for complete search history.

(56) References Cited

U.S. PATENT DOCUMENTS

| | | | | |
|---|---|---|---|---|
| 7,378,919 B2 * | 5/2008 | Zimmerling | ............. | H01P 1/02 333/1 |
| 8,378,223 B1 * | 2/2013 | Shiue | ................... | H05K 1/0245 174/250 |
| 8,835,775 B2 * | 9/2014 | Fan | ...................... | H05K 1/0245 174/250 |
| 2007/0063782 A1 | 3/2007 | Kanno et al. | | |
| 2007/0222533 A1 * | 9/2007 | Lai | ......................... | H01P 3/081 333/4 |
| 2009/0204934 A1 * | 8/2009 | Lin | ..................... | G06F 17/5036 716/130 |
| 2011/0210803 A1 * | 9/2011 | Ou | ....................... | H05K 1/0248 333/4 |

FOREIGN PATENT DOCUMENTS

JP   2005-340506   12/2005
WO  WO 2007/000934   1/2007

* cited by examiner

*Primary Examiner* — Dean Takaoka
*Assistant Examiner* — Alan Wong
(74) *Attorney, Agent, or Firm* — Staas & Halsey LLP

(57) ABSTRACT

A printed board includes: a transmission line that includes a curved region in which a first signal line and a second signal line are arranged separately from each other and curved, wherein the second signal line is arranged on an inner side of the curved region with respect to the first signal line in the curved region and has a portion extending away from the first signal line on a path arranged to be circuitous and extending partially toward the first signal line in the curved region.

7 Claims, 13 Drawing Sheets

PRINTED BOARD AND WIRING ARRANGEMENT METHOD

CROSS-REFERENCE TO RELATED APPLICATION

This application is based upon and claims the benefit of priority of the prior Japanese Patent Application No. 2014-011480 filed on Jan. 24, 2014, the entire contents of which are incorporated herein by reference.

FIELD

The embodiments discussed herein are related to a printed board and a wiring arrangement method.

BACKGROUND

Differential transmission is a transmission method that causes currents with opposite phases to flow in two signal lines and transmits signals using the potential difference between the signal lines. The differential transmission has advantages of high-speed data transmission, high tolerance to noise, and low emission of electromagnetic interference (EMI) noise, compared with single-ended transmission.

In the differential transmission, if phases of two signals, pulse widths of the signals, or amplitudes of the signals are shifted from each other, an unbalanced component that is called a skew may occur. The unbalanced component causes the occurrence of a noise current called a common mode current and causes an erroneous operation of a system. Thus, a differential transmission line has a configuration for suppressing the occurrence of an unbalanced component.

For example, a technique for suppressing undesired mode conversion in a curved region of a transmission line has been proposed. According to this technique, the differential transmission line has a board, a grounded conductive layer formed on the top side of the board, and first and second signal conductors arranged side by side on the bottom side of the board. The first signal conductor and the grounded conductive layer form a first transmission line. The second signal conductor and the grounded conductive layer form a second transmission line. The differential transmission line is formed of the first transmission line and the second transmission line. The differential transmission line includes a curved region. Both ends of the curved region are connected to straight regions. It is assumed that the width of the signal conductor in the curved region is Wb1, the width of the second signal conductor in the curved region is Wb2, the width of a gap between the first signal conductor and the second signal conductor is Gb, the width of the first signal conductor in the straight regions is Ws1, and the width of the second signal conductor in the straight regions is Ws2. In addition, it is assumed that the width of a gap between the first signal conductor and the second signal conductor is Gs, a minimum distance between the center of the curvature of the curved region and a line edge, located on the side of the center of the curvature of the first signal conductor, of the first signal conductor in the curved region is Rb1, and a distance between the center of the curvature of the curved region and a normal to a straight line extending from a line edge, located on the side of the center of the curvature of the first signal conductor, of the first signal conductor in the straight regions is Rs1. According to this technique, undesired mode conversion in the curved region of the transmission line is suppressed by setting these the values Wb1, Ws1, Wb2, Ws2, Gb, Gs, Rb1, and Rs1 so as to ensure that Wb1 is smaller than Ws1, Wb2 is smaller than Ws2, Gb is smaller than Gs, and Rb1 is larger than Rs1.

In addition, the following technique has been proposed: a technique for suppressing a reduction, caused by the unevenness of differential impedance of a differential transmission line, in the quality of transmission in a printed board in which the differential transmission line composed of a first wiring and a second wiring and an element connected to the differential transmission line are mounted in a wiring layer that is in contact with a dielectric layer. According to this technique, the width of the first wiring and the width of the second wiring are gradually reduced to a predetermined width on the side of one of ends of each of the first and second wirings, and the first and second wirings are axisymmetric in a region in which the widths of the first and second wirings are gradually reduced.

International Publication Pamphlet No. 2007/000934 and Japanese Laid-open Patent Publication No. 2005-340506 are examples of related art.

FIG. 1 is a diagram illustrating an example of a wiring pattern of a pair of signal lines that form a differential transmission line. A differential transmission line 100 includes a first signal line 101 and a second signal line 102. The first and second signal lines 101 and 102 are curved at an angle of 90° in a curved region 103. The second signal line 102 is arranged on the inner side of the curved region 103 and is a meander line curved and extending away from the first signal line 101 and the difference between the lengths of the first and second signal lines 101 and 102 is reduced. If the difference between the lengths of the first and second signal lines 101 and 102 is large, the difference between the phases of two signals transmitted in the first and second signal lines 101 and 102 may occur and cause the occurrence of an unbalanced component. It is, therefore, preferable that the difference between the lengths of the first and second signal lines 101 and 102 be small.

However, if the differential transmission line includes the meander line, the area of a region occupied by the signal lines may be large and it may be difficult to design a pattern of the differential transmission line. FIG. 2 is a diagram comparing a region (illustrated on the upper side) occupied by differential transmission lines including meander lines with a region (illustrated on the lower side) occupied by differential transmission lines without a meander line. In an example illustrated in FIG. 2, differential transmission lines 100A to 100D that include meander lines are arranged side by side, form four signal line pairs, and extend in a direction intersecting with a direction in which signal lines extend, and differential transmission lines 100E to 100H without a meander line are arranged side by side, form four signal line pairs, and extend in the direction intersecting with the direction in which the signal lines extend. The differential transmission lines 100A to 100D that form the signal line pairs have meander portions 101A to 104A included in signal lines of the signal line pairs and curved and extending away from the other signal lines of the signal line pairs. It is assumed that inter-wiring distances (wiring pitches) L between the signal lines of the differential transmission lines 100A to 100D including the meander lines and inter-wiring distances (wiring pitches) L between the signal lines of the differential transmission lines 100E to 100H without a meander line are equal to each other and that distances M between adjacent differential transmission lines are equal to each other. As illustrated in FIG. 2, a region R1 in which the differential transmission lines 100A and 100D that form the four pairs and include the meander lines are arranged is larger than a region R2 in which the differential transmission lines 100E to 100H that do not include a meander line are arranged. In addition, as illustrated in FIG. 3, if the differential transmission lines 100A and 100D that form the four pairs are curved, the area of the region occupied by the differential transmission lines 100A and 100D is further increased.

As described above, if a differential transmission line includes a meander line, the area of a region occupied by signal lines of the differential transmission line is increased. In order to suppress the increase, it is considered that the widths of curves of the meander line are reduced. In this case, however, the number of the curves is increased in order to reduce the difference between the length of the meander line and the length of another line of the differential transmission line. If a sufficient number of curves are not secured, the difference between the lengths may not be sufficiently reduced.

SUMMARY

According to an aspect of the invention, a printed board includes: a transmission line that includes a curved region in which a first signal line and a second signal line are arranged separately from each other and curved, wherein the second signal line is arranged on an inner side of the curved region with respect to the first signal line in the curved region and has a portion extending away from the first signal line on a path arranged to be circuitous and extending partially toward the first signal line in the curved region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, an example of embodiments of the technique disclosed herein is described with reference to the accompanying drawings.

First Embodiment

Figure 4:
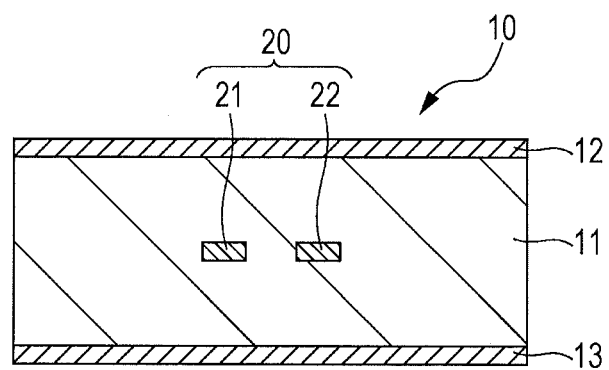
FIG. 4 is a cross-sectional view of a printed board according to a first embodiment of the technique disclosed herein.

FIG. 4 is a cross-sectional view of a printed board 10 according to a first embodiment of the technique disclosed herein. The printed board 10 includes a dielectric layer 11, conductive films 12 and 13 covering top and bottom surfaces of the dielectric layer 11, and first and second signal lines 21 and 22 formed of conductive bodies and arranged within the dielectric layer 11. Specifically, the printed board 10 has strip lines formed therein. In addition, the first signal line 21 and the second signal line 22 form a differential transmission line 20. In the printed board 10, when a ground potential is provided to the conductive films 12 and 13, and signals with opposite phases are input to the first and second signal lines 21 and 22 and may be transmitted by a differential transmission method. In the printed board 10, electromagnetic waves are transmitted by electric fields in directions from the first and second signal lines 21 and 22 to the conductive films 12 and 13 and a magnetic field in a circumferential direction surrounding the first and second signal lines 21 and 22.

Metal such as copper may be used as a material of the conductive films 12 and 13 and a material of the first and second signal lines 21 and 22, for example. In addition, a glass epoxy member may be used as the dielectric layer 11. In the first embodiment, the strip lines are formed in the printed board 10. The printed board 10 may have microstrip lines formed therein. In this case, the microstrip lines form a transmission line having a structure in which a conductive film is formed on one of the surfaces of the dielectric layer and signal lines are formed on the other surface of the dielectric layer.

The printed board 10 is an example of a printed board according to the technique disclosed herein. The differential transmission line 20 is an example of a transmission line according to the technique disclosed herein. The first signal line 21 is an example of a first signal line according to the technique disclosed herein. The second signal line 22 is an example of a second signal line according to the technique disclosed herein.

Figure 5:
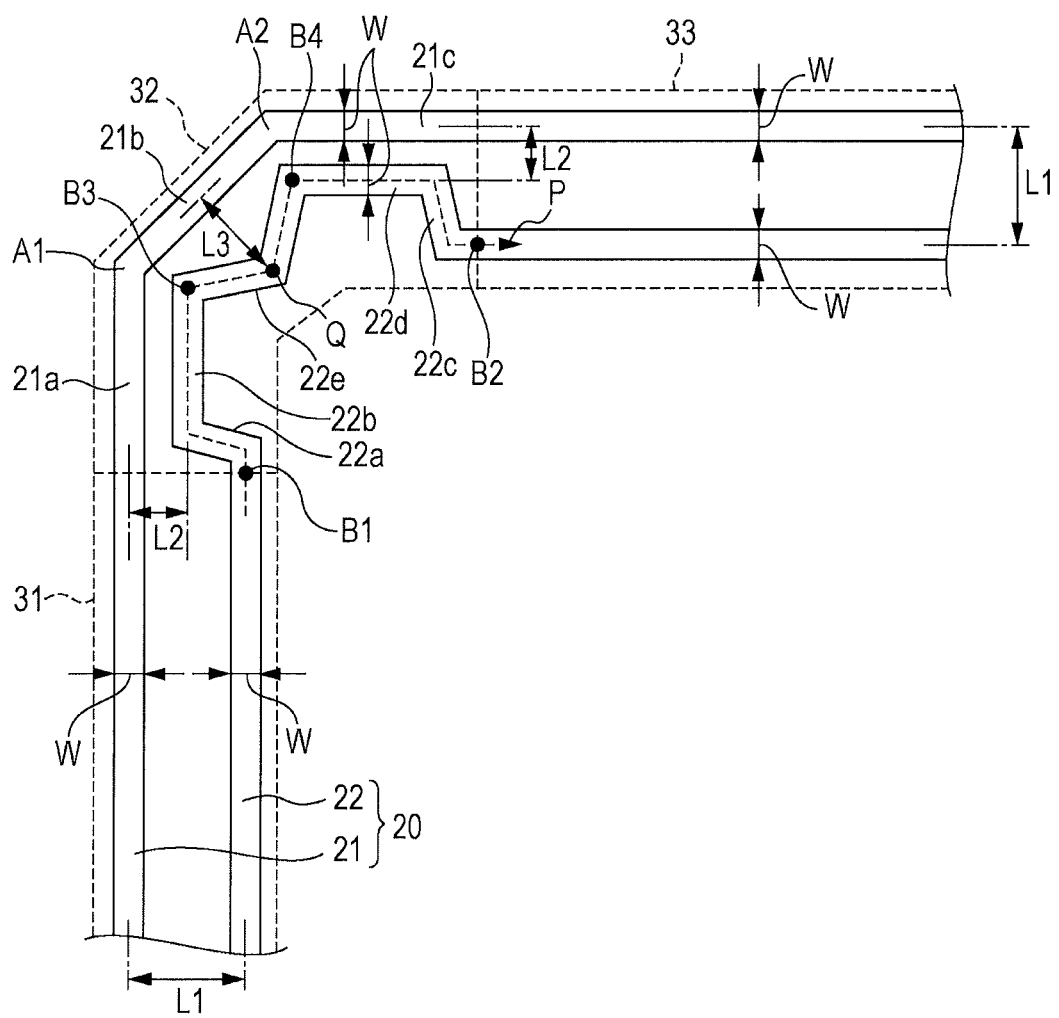
FIG. 5 is a diagram illustrating a partial wiring pattern of a differential transmission line according to the first embodiment of the technique disclosed herein.

FIG. 5 is a diagram illustrating a partial wiring pattern of the differential transmission line 20 according to the first embodiment of the technique disclosed herein. The differential transmission line 20 has a first straight region 31 in which the first signal line 21 and the second signal line 22 extend straight. In addition, the differential transmission line 20 has a second straight region 33 in which the first signal line 21 and the second signal line 22 extend straight in a direction perpendicular to a direction in which the first signal line 21 and the second signal line 22 extend straight in the first straight region 31. In the first and second straight regions 31 and 33, the first and second signal lines 21 and 22 extend in parallel, and inter-wiring distances (wiring pitches) L1 between the first and second signal lines 21 and 22 are, for example, 450 µm. In the present specification, the inter-wiring distances (wiring pitches) between the signal lines are distances between central lines of the first and second signal lines 21 and 22. The inter-wiring distance between the first and second signal lines 21 and 22 in the first straight region 31 may be different from the inter-wiring distance between the first and second signal lines 21 and 22 in the second straight region 33. In the first embodiment, the widths W of the first and second signal lines 21 and 22 are a fixed value or are, for example, 120 µm in a whole region of the differential transmission line 20 or in the first and second straight regions 31 and 33 and a curved region 32 (described later). The widths of the first and second signal lines 21 and 22 in the straight region 31 may be different from the widths thereof in the straight region 33 and the widths thereof in the curved region 32. The widths of the first and second signal lines 21 and 22 in the straight region 33 may be different from the widths thereof in the curved region 32.

The differential transmission line 20 has the curved region 32 that is located between the first and second straight regions 31 and 32 and in which the first and second signal lines 21 and 22 are curved. Specifically, the first straight region 31 is adjacent to one of ends of the curved region 32, while the second straight region 33 is adjacent to the other end of the curved region 32. In the curved region 32, the first and second signal lines 21 and 22 are curved at an angle of 90° so as to ensure that directions in which the first and second signal lines 21 and 22 extend in the curved region 32 match the directions in which the first and second signal lines 21 and 22 extend in the first and second straight regions 31 and 32. The first and second straight regions 31 and 33 are an example of a straight region according to the technique disclosed herein. The curved region 32 is an example of a curved region according to the technique disclosed herein.

In the curved region 32, the first signal line 21 is located on the outer side of the curved region 32 with respect to the second signal line 22, and the second signal line 22 is located on the inner side of the curved region 32 with respect to the first signal line 21. In other words, the first signal line 21 is arranged on the side (left side in the first embodiment) opposite to the side (right side in the first embodiment) toward which the region 32 is curved with respect to the second signal line 22. The second signal line 22 is located on the same side (right side in the first embodiment) as the side (right side in the first embodiment) toward which the region 32 is curved with respect to the first signal line 21.

In the curved region 32, the first signal line 21 has a wiring portion 21a connected to the first straight region 31 and extending in the same direction as the direction in which the first signal line 21 extends in the first straight region 31. In addition, in the curved region 32, the first signal line 21 has a wiring portion 21b connected to the wiring portion 21a and extending straight in a direction inclined toward the right side at an angle of 45° with respect to the direction in which the wiring portion 21a extends. In addition, in the curved region 32, the first signal line 21 has a wiring portion 21c connected to the wiring portion 21b and the second straight region 33 and extending straight in a direction inclined toward the right side at an angle of 45° with respect to the direction in which the wiring portion 21b extends. The direction in which the wiring portion 21c extends is the same as the direction in which the first signal line 21 extends in the second straight region 33. In this manner, the first signal line 21 has two curved portions A1 and A2 in the second curved region 32 and is curved at two points so as to ensure that the direction in which the first signal line 21 extends changes at an angle of 90°.

In the curved region 32, the second signal line 22 is curved entirely along the first signal line 21. In the curved region 32, the second signal line 22 has a wiring portion 22a connected to the first straight region 31 at a connection point B1 and extending from the connection point B1 toward the first signal line 21. In addition, in the curved region 32, the second signal line 22 has a wiring portion 22b connected to the wiring portion 22a and extending in parallel to the wiring portion 21a of the first signal line 21. An inter-wiring distance L2 between the wiring portion 21a of the first signal line 21 and the wiring portion 22b of the second signal line 22 is smaller than the inter-wiring distances L1 between the first and second signal lines 21 and 22 in the first and second straight regions 31 and 33 and is, for example, 200 µm. A wiring portion that is included in the second signal line 22 and includes the wiring portions 22a and 22b is arranged to be circuitous and extends toward the first signal line 21 and is an example of a first wiring portion according to the technique disclosed herein.

In addition, in the curved region 32, the second signal line 22 has a wiring portion 22c connected to the second straight region 33 at a connection point B2 and extending from the connection point B2 toward the first signal line 21. In addition, in the curved region 32, the second signal line 22 has a wiring portion 22d connected to the wiring portion 22c and extending in parallel to the wiring portion 21c of the signal line 21. An inter-wiring distance L2 between the wiring portion 21c of the first signal line 21 and the wiring portion 22d of the second signal line 22 is smaller than the inter-wiring distances L1 between the first and second signal lines 21 and 22 in the first and second straight regions 31 and 33 and is, for example, 200 µm. A wiring portion that is included in the second signal line 22 and includes the wiring portions 22c and 22d is arranged to be circuitous and extends toward the first signal line 21 and is an example of a second wiring portion according to the technique disclosed herein. The inter-wiring distance between the wiring portion 21a of the first signal line 21 and the wiring portion 22b of the second signal line 22 may be different from the inter-wiring distance between the wiring portion 21c of the first signal line 21 and the wiring portion 22d of the second signal line 22.

In addition, in the curved region 32, the second signal line 22 has a detour path P arranged to be circuitous and extending partially toward the first signal line 21. The second signal line 22 has a wiring portion 22e curved and extending away from the first signal line 21 on the detour path P formed in the curved region 32. The wiring portion 22e extends through a point Q at which a distance L3 between the first signal line 21 and the wiring portion 22e is larger than the aforementioned inter-wiring distances L2. The wiring portion 22e extends from a connection point B3 through the point Q to a connection point B4, while being connected to the wiring portion 22b at the connection point B3, sharply curved at the point Q, and connected to the wiring portion 22d at the connection point B4. The wiring portion 22e is an example of a third wiring portion according to the technique disclosed herein. An upper limit of the distance L3 may be set to a length corresponding to the inter-wiring distances L1 between the first and second signal lines 21 and 22 in the first and second straight regions 31 and 33.

Figure 6:
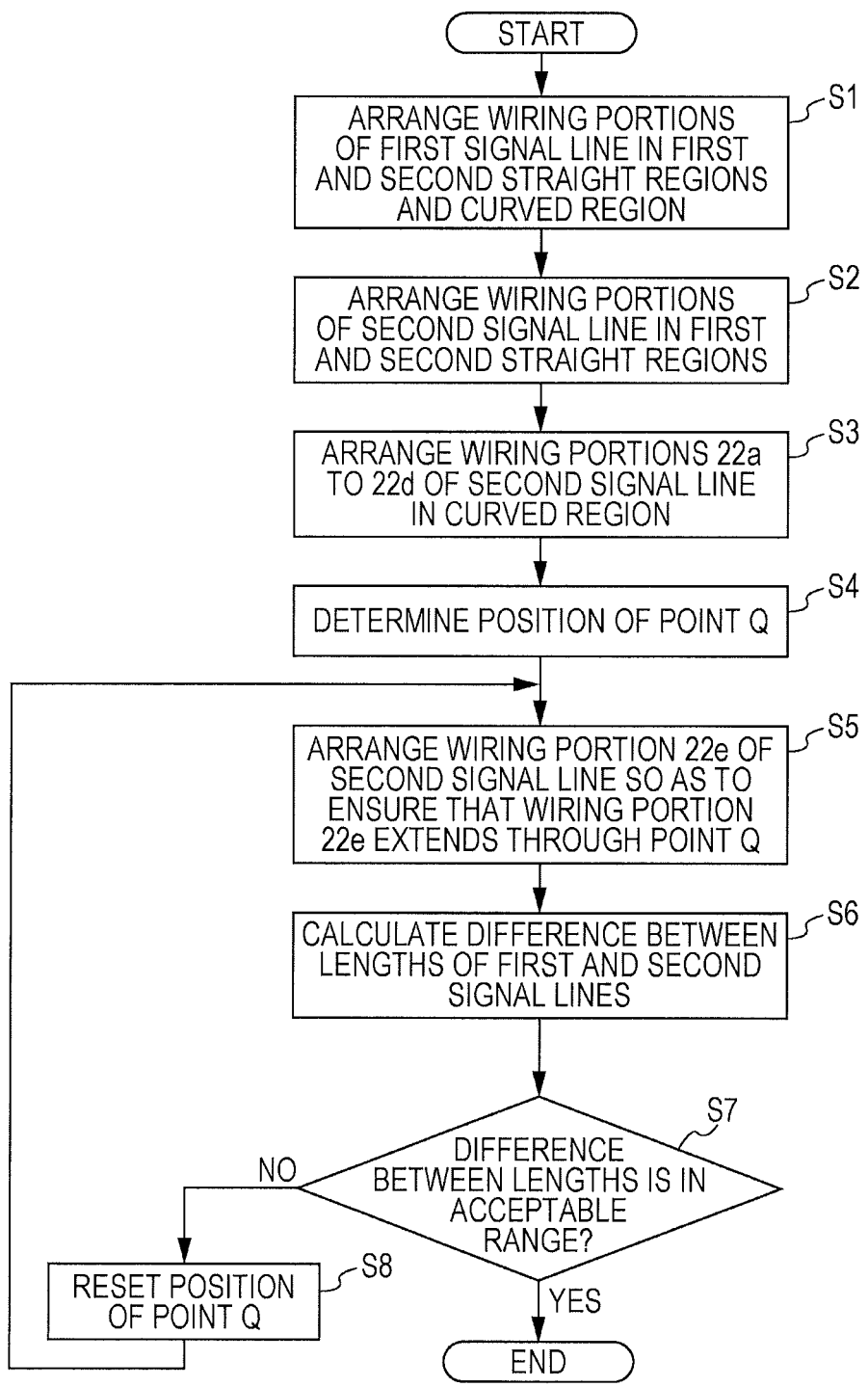
FIG. 6 is a flowchart of an example of a procedure for designing a pattern of the differential transmission line according to the first embodiment of the technique disclosed herein.

Hereinafter, a method for arranging the wiring portions of the differential transmission line 20 is described. FIG. 6 is a flowchart of an example of a procedure for designing a wiring pattern of the first and second signal lines 21 and 22 that form the differential transmission line 20.

In step S1, the wiring portions of the first signal line 21 are arranged in the first straight region 31, the curved region 32, and the second straight region 33. The width of the first signal line 21 may be 120 μm, for example. Step S1 is an example of a first process according to the technique disclosed herein.

In step S2, the wiring portions of the second signal line 22 are arranged and extend in parallel to the first signal line 21 in the first straight region 31 and the second straight region 33. In the first and second straight regions 31 and 33, the inter-wiring distances L1 between the first and second signal lines 21 and 22 may be 450 μm, for example. The width W of the second signal line 22 may be 120 μm, for example.

In step S3, the wiring portions 22a to 22d of the second signal line 22 are arranged in the curved region 32. Specifically, the wiring portion 22b of the second signal line 22 is arranged in the curved region 32 and extends in parallel to the wiring portion 21a of the first signal line 21 so as to ensure that the inter-wiring distance L2 between the wiring portion 22b and the wiring portion 21a of the first signal line 21 is, for example, 200 μm. After that, the wiring portion 22a of the second signal line 22 is arranged so as to ensure that the curved region 32 is connected to the first straight region 31.

In addition, the wiring portion 22d of the second signal line 22 is arranged in the curved region 32 and extends in parallel to the wiring portion 21c of the first signal line 21 so as to ensure that the inter-wiring distance L2 between the wiring portion 22d and the wiring portion 21c of the first signal line 21 is, for example, 200 μm. After that, the wiring portion 22c of the second signal line 22 is arranged so as to ensure that the curved region 32 is connected to the second straight region 33. In this manner, the wiring portions of the second signal line 22 are arranged so as to be circuitous and extend from both ends of the curved region 32 toward the first signal line 21 in the curved region 32.

In step S4, an arbitrary position that is located between the wiring portions 22b and 22d of the second signal line 22 and at which the distance L3 between the second signal line 22 and the first signal line 21 is larger than the distances L2 is determined as the position of the point Q.

In step S5, the wiring portion 22e of the second signal line 22 is arranged so as to ensure that one of ends of the wiring portion 22e is connected to the wiring portion 22b, the other end of the wiring portion 22 is connected to the wiring portion 22d, and the wiring portion 22e extends through the point Q located between the ends of the wiring portion 22e. Steps S2 to S5 are an example of a second process according to the technique disclosed herein.

In step S6, the difference between the lengths of the first and second signal lines 21 and 22 is calculated. In step S6, a delay of an electromagnetic wave transmitted through one of the first and second signal lines 21 and 22 with respect to an electromagnetic wave transmitted through the other of the first and second signal lines 21 and 22 may be calculated by electromagnetic analysis.

In step S7, whether or not the difference, calculated in step S6, between the lengths of the first and second signal lines 21 and 22 is in an acceptable range is determined. If it is determined that the difference between the lengths is not in the acceptable range in step S7, the procedure proceeds to step S8. If it is determined that the difference between the lengths is in the acceptable range in step S7, the procedure is terminated. If the delay is calculated in step S6, whether or not the delay is in an acceptable range is determined in step S7.

In step S8, the position of the point Q is reset. For example, if it is determined that the length of the second signal line 22 is shorter by a value exceeding the acceptable range than the length of the first signal line 21, the position of the point Q is moved so as to be farther from the first signal line 21 (or so as to ensure that the distance L3 is increased). On the other hand, if it is determined that the length of the second signal line 22 is longer by a value exceeding the acceptable range than the length of the first signal line 21, the position of the point Q is moved so as to be closer to the first signal line 21 (or so as to ensure that the distance L3 is reduced). After the position of the point Q is reset in step S8, the procedure returns to step S5.

In step S5, the wiring portion 22e of the second signal line 22 is rearranged so as to extend through the reset point Q. Subsequently, in step S6, the difference between the lengths of the first and second signal lines 21 and 22 is recalculated. In step S7, whether or not the recalculated difference between the lengths is in the acceptable range is determined. This routine is repeatedly executed until the difference between the lengths of the first and second signal lines 21 and 22 becomes in the acceptable range. The aforementioned procedure is an example, and at least two of the processes of steps S1 to S8 may be replaced with each other. For example, the second signal line 22 may be arranged before the arrangement of the first signal line 21. In addition, the order of arranging the wiring portions 22a to 22e of the signal line 22 may be changed. In addition, the wiring portions of the second signal line 22 may be arranged in order from the first straight region 31 through the curved region 32 to the second straight region 33.

Figure 1:
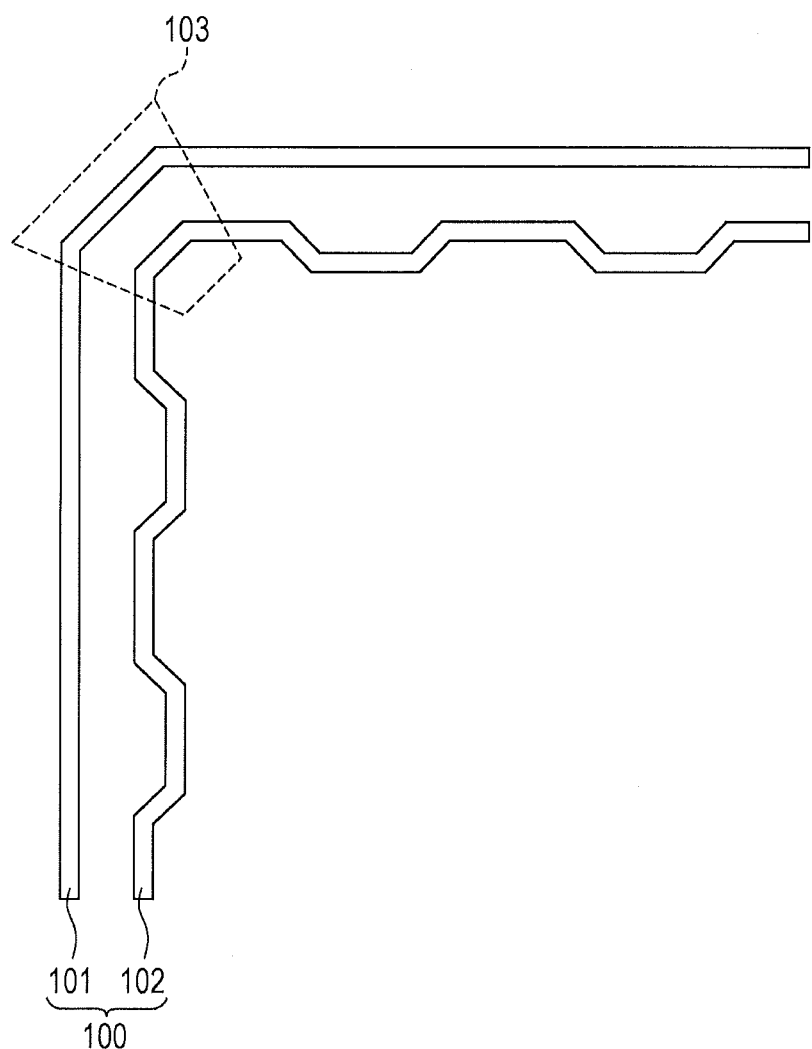
FIG. 1 is a diagram illustrating an example of a wiring pattern of a pair of signal lines forming a differential transmission line.
Figure 2:
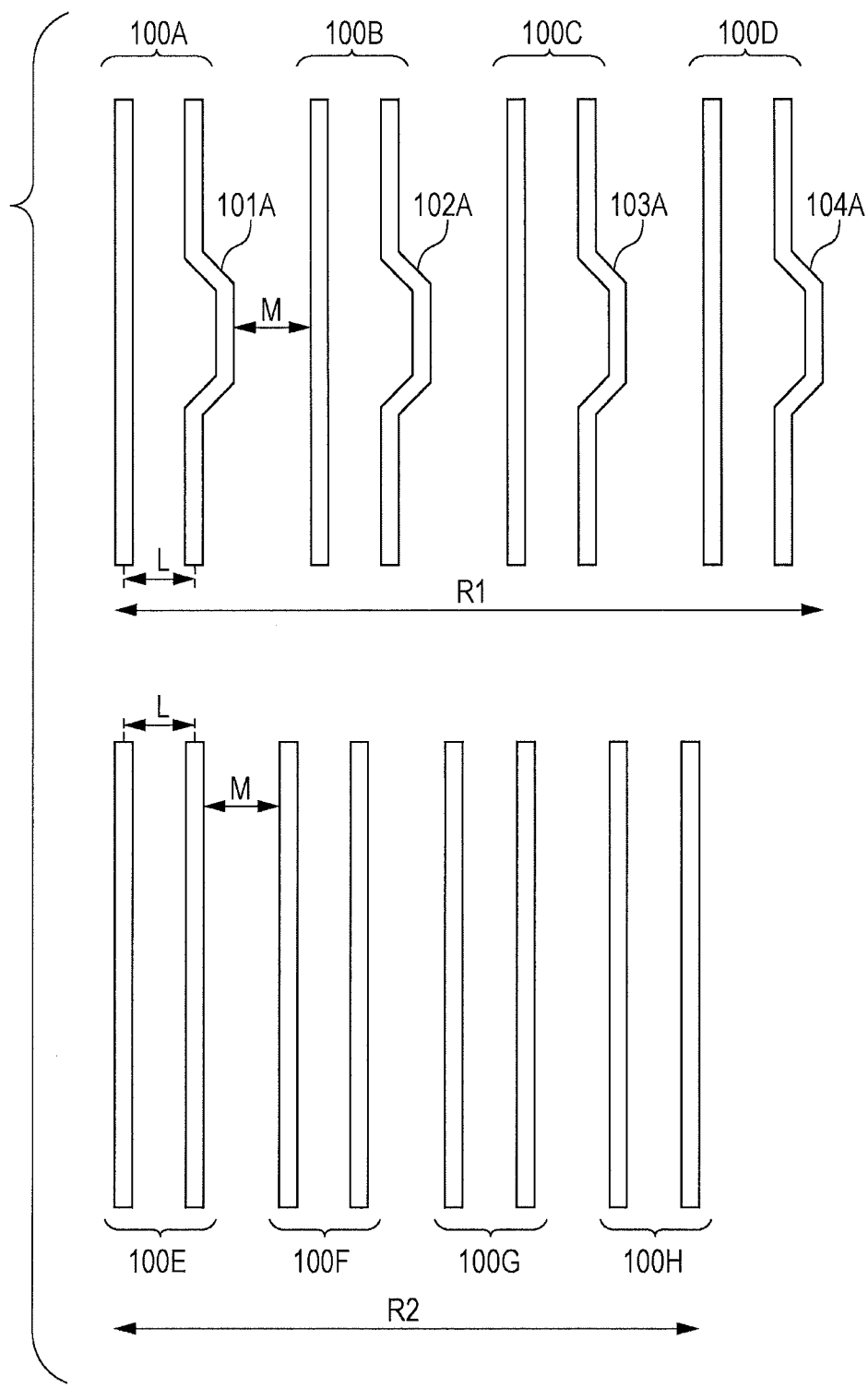
FIG. 2 is a diagram illustrating a region occupied by differential transmission lines including meander lines and a region occupied by differential transmission lines without a meander line.
Figure 3:
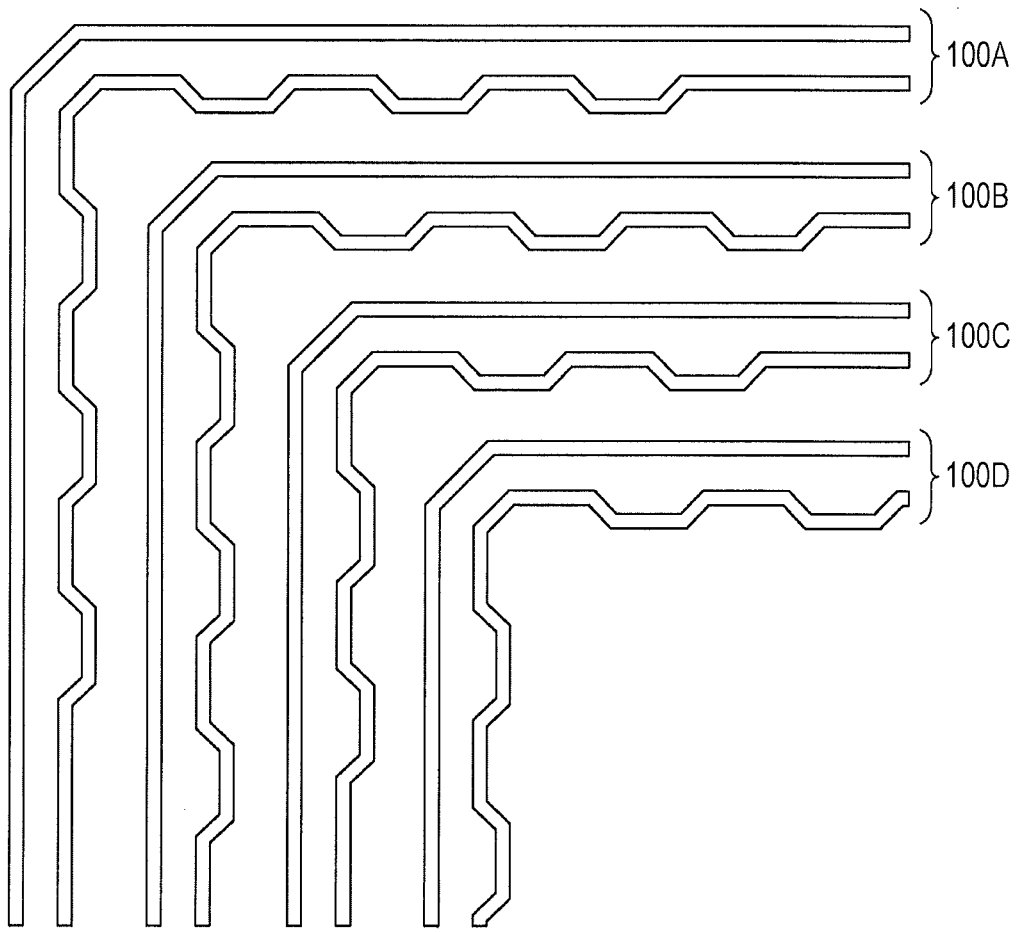
FIG. 3 is a diagram illustrating a wiring pattern in which a plurality of differential transmission lines curved in a direction are arranged.

In the differential transmission line 20 according to the first embodiment, in the curved region 32, the second signal line 22 is arranged to be circuitous on the inner side of the curved region 32 and extends toward the first signal line 21 arranged on the outer side so as to ensure that the difference between the lengths of the first and second signal lines 21 and 22 is reduced. The differential transmission line 20 according to the first embodiment does not include a meander line curved and extending away from the other signal line in the straight regions as illustrated in FIG. 1, and thus the area of a region occupied by the signal lines is not increased. Specifically, the differential transmission line 20 according to the first embodiment may have an arrangement region that is similar in size to a differential transmission line that does not include a meander portion.

Figure 7:
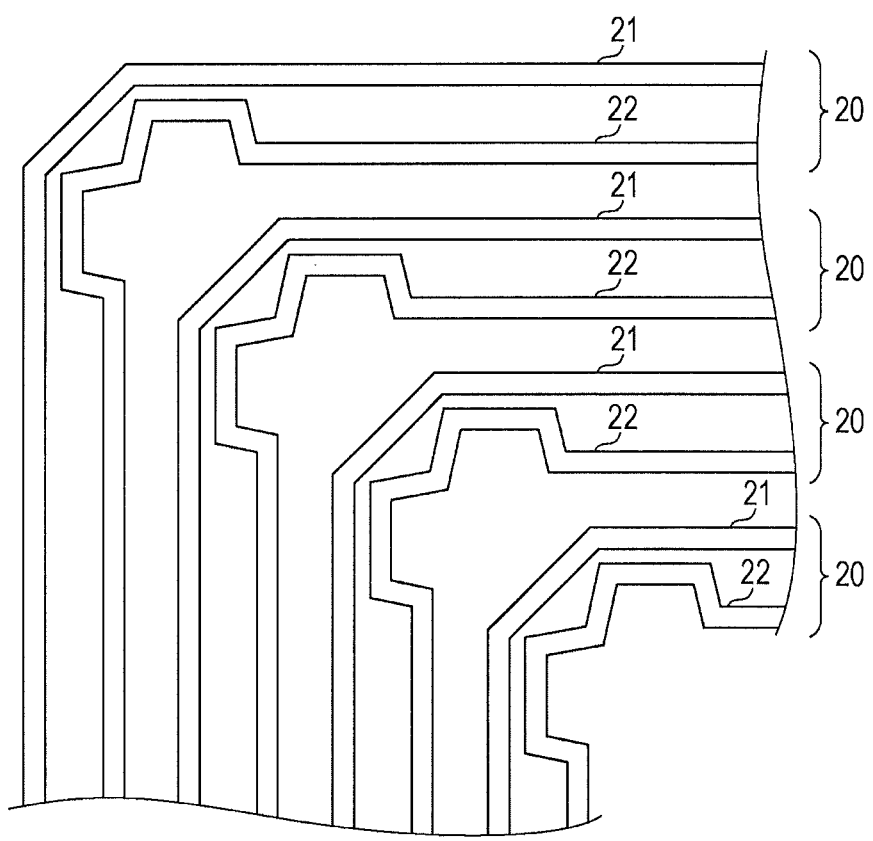
FIG. 7 is a diagram illustrating a wiring pattern of differential transmission lines according to the first embodiment of the technique disclosed herein that form four signal line pairs.

FIG. 7 is a diagram illustrating a wiring pattern of differential transmission lines 20 according to the first embodiment that form four signal line pairs. Since the area of the region occupied by the signal lines of the differential transmission line 20 according to the first embodiment is not increased as described above, a region for the arrangement of another transmission line is easily secured and a pattern in which a plurality of differential transmission lines are arranged as illustrated in FIG. 7 is easily designed.

As is apparent from the above description, the printed board 10 that includes the differential transmission line 20 according to the first embodiment may suppress an increase in the area of the region occupied by the signal lines upon a reduction in the difference between the lengths of the first and second signal lines 21 and 22.

In the differential transmission line 20 according to the first embodiment, the second signal line 22 has the detour path P formed to be circuitous and extending partially toward the first signal line 21 in the curved region 32 and has the wiring portion 22e curved and extending away from the first signal line 21 on the detour path P. Since the second signal line 22 has the wiring portion 22e sharply curved on the detour path P, the length of the second signal line 22 may be large. Thus, an adjustable range of the length of the second signal line 22 may be large and the difference between the lengths of the first and second signal lines 21 and 22 may be reduced.

In addition, the length of the second signal line 22 may be easily adjusted by moving the position of the point Q toward the side of the first signal line 21 or toward the opposite side of the first signal line 21 (or by changing the distance L3). Specifically, as illustrated in FIG. 6, in order to adjust the length of the second signal line 22 and reduce the difference between the lengths of the first and second signal lines 21 and 22, it is sufficient if a pattern of the second signal line 22 is slightly changed. Thus, a pattern of the differential transmission line 20 may be efficiently designed.

Figure 8:
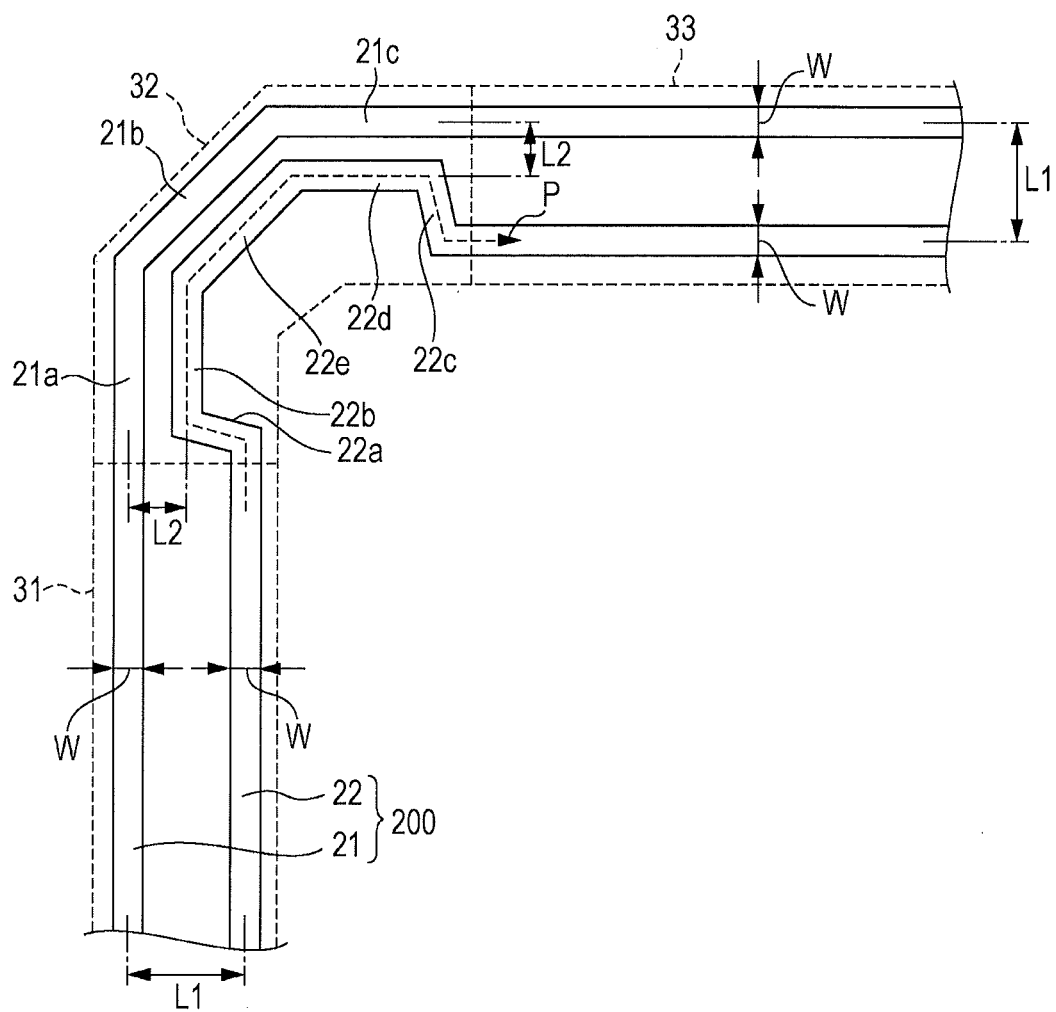
FIG. 8 is a diagram illustrating a wiring pattern of a differential transmission line according to a comparative example.

FIG. 8 illustrates a wiring pattern of a differential transmission line 200 according to a comparative example. In FIG. 8, constituent elements that are the same as or correspond to the differential transmission line 20 according to the first embodiment of the technique disclosed herein are represented by the same reference numerals and symbols as those used in the first embodiment, and a detailed description thereof is omitted. The differential transmission line 200 according to the comparative example does not include a wiring portion curved and extending away from a first signal line 21 on a detour path P formed by a second signal line 22 in a curved region 32.

Figure 9A:
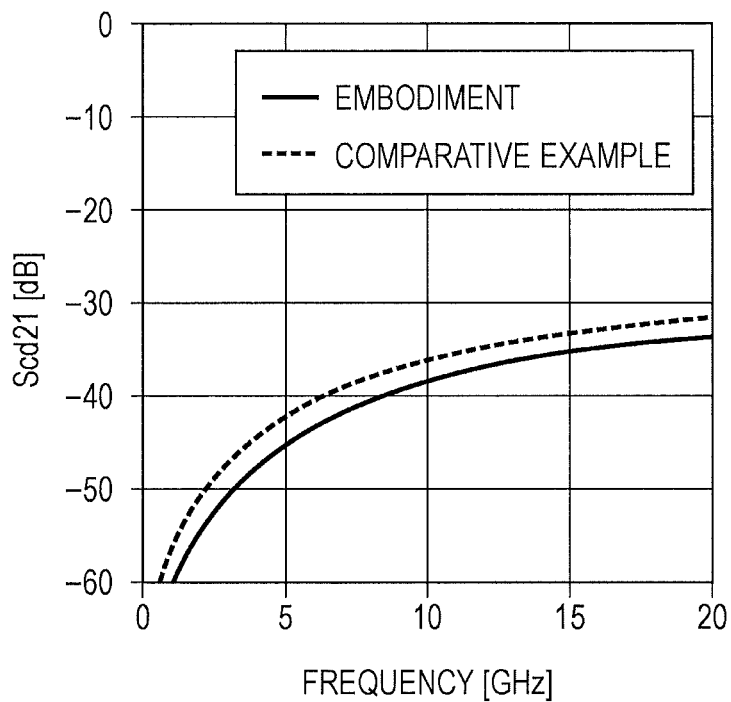
FIG. 9A is a diagram illustrating Scd21 characteristics of the differential transmission line according to the first embodiment of the technique disclosed herein and Scd21 characteristics of the differential transmission line according to the comparative example.
Figure 9B:
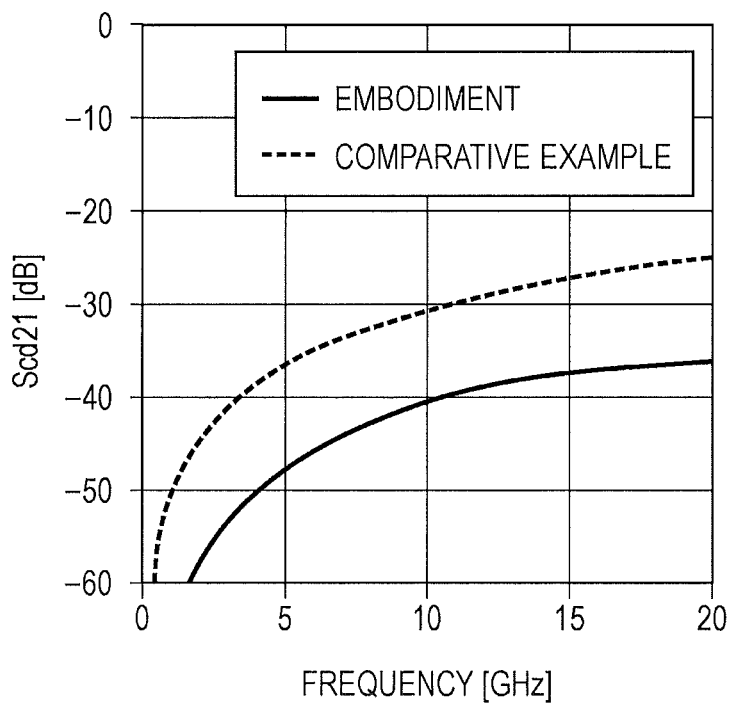
FIG. 9B is a diagram illustrating Scd21 characteristics of the differential transmission line according to the first embodiment of the technique disclosed herein and Scd21 characteristics of the differential transmission line according to the comparative example.

FIGS. 9A and 9B are diagrams illustrating Scd21 characteristics of the differential transmission line 20 according to the first embodiment of the technique disclosed herein and Scd21 characteristics of the differential transmission line 200 according to the comparative example. Scd21 represents a rate of converting a differential mode signal input in a transmission line into a common mode component. Specifically, the smaller the difference between the lengths of a pair of signal lines forming a differential transmission line, the smaller an Scd21 value. Thus, by comparing the Scd21 characteristics of the differential transmission line 20 according to the first embodiment of the technique disclosed herein with the Scd21 characteristics of the differential transmission line 200 according to the comparative example, the difference between the lengths of the signal lines forming the differential transmission line 20 may be compared with the difference between the lengths of signal lines forming the differential transmission line 200.

FIG. 9A illustrates the Scd21 characteristics when the inter-wiring distances L1 in the first and second straight regions 31 and 33 are 450 μm, the inter-wiring distances L2 in the curved region 32 are 200 μm, and the widths of the first and second signal lines 21 and 22 are 120 μm. FIG. 9B illustrates the Scd21 characteristics when the inter-wiring distances L1 in the first and second straight regions 31 and 33 are reduced to 400 μm.

In FIGS. 9A and 9B, solid lines correspond to the differential transmission line 20 according to the first embodiment of the technique disclosed herein, and broken lines correspond to the differential transmission line 200 according to the comparative example. In the differential transmission line 20 according to the first embodiment, the position (distance L3) of the point Q on the second signal line 22 is adjusted so as to ensure that the length of the first signal line 21 is equal to the length of the second signal line 21.

As illustrated in FIGS. 9A and 9B, Scd21 values of the differential transmission line 20 according to the first embodiment are smaller than Scd21 values of the differential transmission line 200 according to the comparative example, and it may be understood that the difference between the lengths of the first signal lines 21 and 22 of the differential transmission line 20 according to the first embodiment is smaller than the difference between the lengths of the signal lines 21 and 22 of the differential transmission line 200 according to the comparative example. Specifically, since the differential transmission line 200 according to the comparative example does not include the wiring portion curved and extending away from the first signal line 21 on the detour path P (refer to FIG. 8), a reduction in the difference between the lengths of the first and second signal lines 21 and 22 of the differential transmission line 200 according to the comparative example is limited. In addition, in the configuration of the differential transmission line 200 according to the comparative example, the smaller the inter-wiring distances L1 in the first and second straight regions 31 and 33, the more difficult it is to reduce the difference between the lengths of the first and second signal lines 21 and 22. Specifically, as is apparent from the comparison of FIGS. 9A and 9B, in the differential transmission line 200 according to the comparative example, when the inter-wiring distances L1 in the first and second straight regions 31 and 33 are reduced, the difference between the lengths of the first and second signal lines 21 and 22 increases and the Scd21 values increase.

Figure 10:
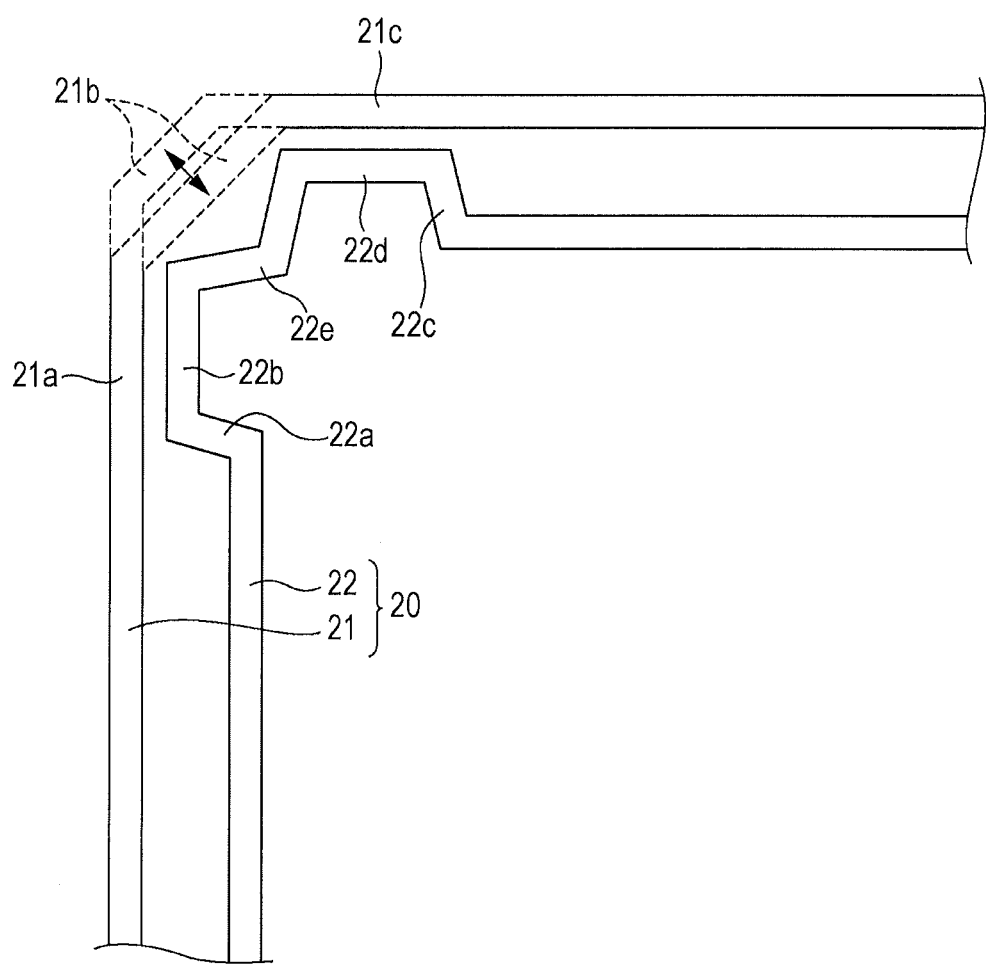
FIG. 10 is a diagram illustrating a partial wiring pattern of the differential transmission line according to the first embodiment of the technique disclosed herein.

On the other hand, the differential transmission line 20 according to the first embodiment includes the wiring portion 22e curved and extending away from the first signal line 21 on the detour path P arranged to be circuitous and extending partially toward the first signal line 21. Thus, the difference between the lengths of the first and second signal lines 21 and 22 of the differential transmission line 20 according to the first embodiment may be smaller than the differential transmission line 200 according to the comparative example. In addition, in the differential transmission line 20 according to the first embodiment, even if the inter-wiring distances L1 in the first and second straight regions 31 and 33 are reduced, the difference between the lengths of the first and second signal lines 21 and 22 may be reduced by adjusting the position of the point Q on the second signal line 22 in the curved region 32. In the differential transmission line 20 according to the first embodiment, the wiring portion 22e of the second signal line 22 has, as an adjuster, a function of adjusting the length of the second signal line 22. The difference between the lengths of the first and second signal lines 21 and 22 may be reduced by moving the position of the point Q and moving the wiring portion 21b of the first signal line 21 in parallel as illustrated in FIG. 10. In this manner, a pattern in the first and second straight regions 31 and 33 may be determined by consolidating, in the curved region 32, the portions for adjusting the lengths of the first and second signal lines 21 and 22, and a pattern of the differential transmission line 20 may be efficiently designed.

Second Embodiment

Figure 11:
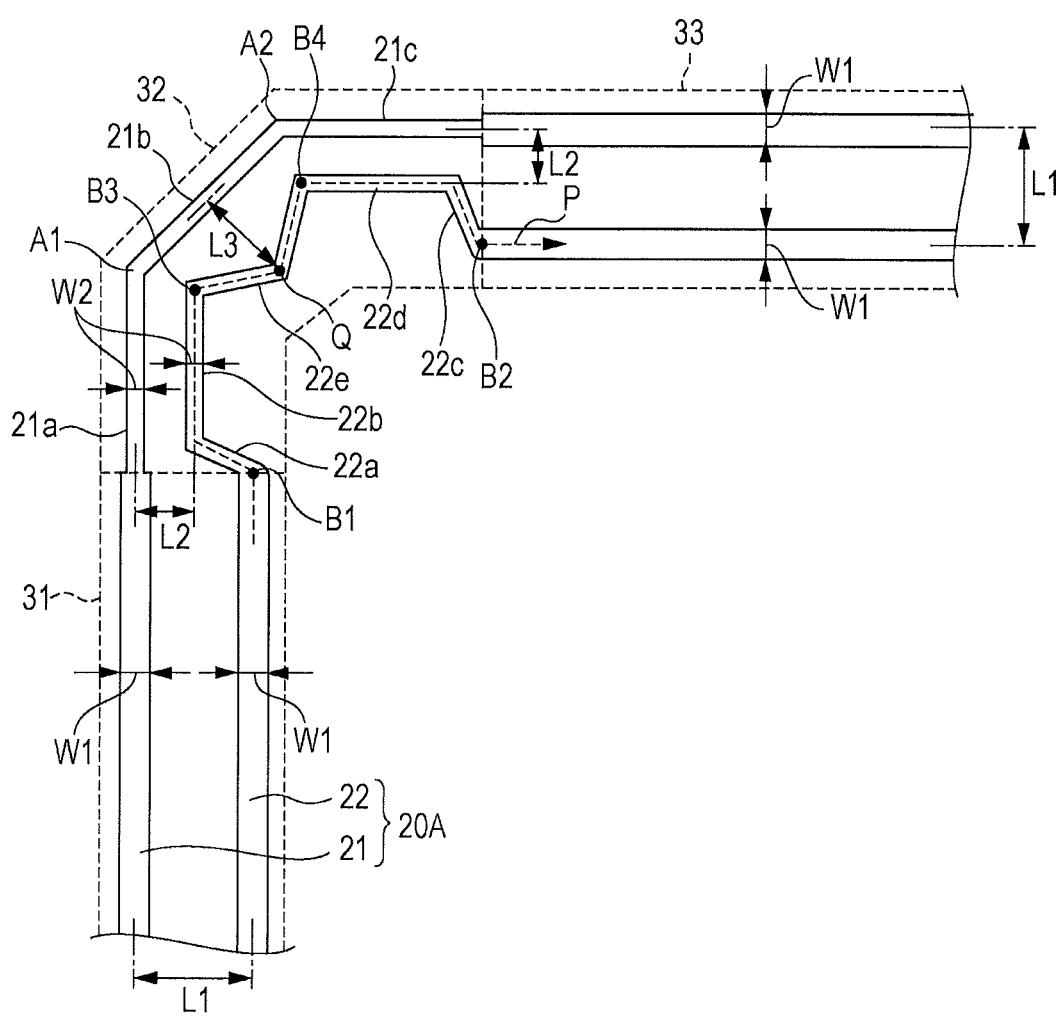
FIG. 11 is a diagram illustrating a partial wiring pattern of a differential transmission line according to a second embodiment of the technique disclosed herein.

FIG. 11 is a diagram illustrating a partial wiring pattern of a differential transmission line 20A according to a second embodiment of the technique disclosed herein. In FIG. 11, constituent elements that are the same as or correspond to the differential transmission line 20 according to the first embodiment are represented by the same reference numerals and symbols as those used in the first embodiment, and a detailed description thereof is omitted. A configuration of a printed board that includes the differential transmission line 20A according to the second embodiment is the same as or similar to the configuration, illustrated in FIG. 4, of the printed board 10 according to the first embodiment.

In the differential transmission line 20A according to the second embodiment, the widths W2 of the first and second signal lines 21 and 22 in the curved region 32 are smaller than the widths W1 of the first and second signal lines 21 and 22 in the first and second straight regions 31 and 33. As an example, the widths W2 of the first and second signal lines 21 and 22 in the curved region 32 may be 100 μm and the widths W1 of the first and second signal lines 21 and 22 in the first and second straight regions 31 and 33 may be 120 μm. Other configurations of the differential transmission line 20A according to the second embodiment are the same as or similar to the differential transmission line 20 according to the first embodiment.

Figure 12A:
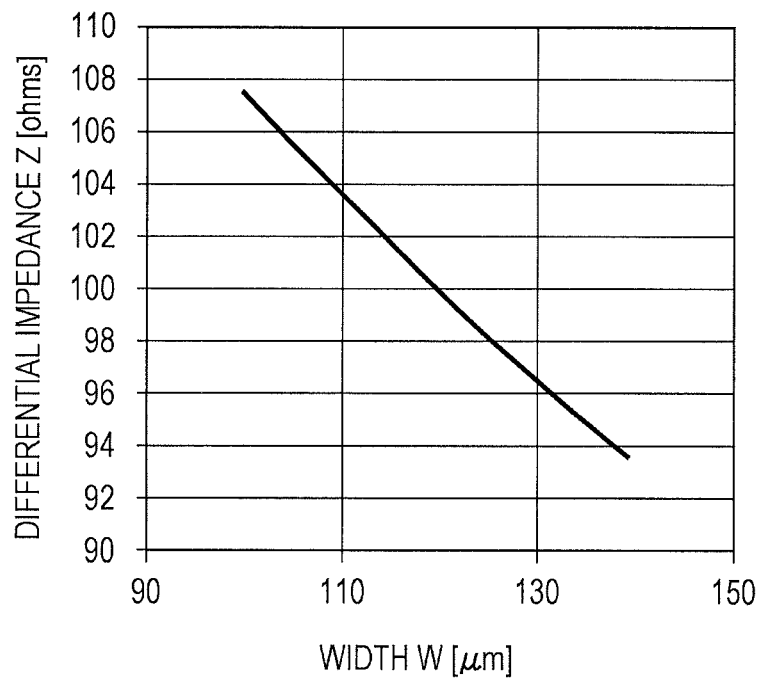
FIG. 12A is a diagram illustrating a relationship between the widths of a pair of signal lines forming the differential transmission line and differential impedance.

FIG. 12A is a diagram illustrating a relationship between the widths W of the pair of signal lines forming the differential transmission line and differential impedance Z. In FIG. 12A, the inter-wiring distance L between the pair of signal lines is set to a fixed value or 450 μm. As illustrated in FIG. 12A, there is a tendency that as the widths W of the pair of signal lines are reduced, the differential impedance Z is reduced.

Figure 12B:
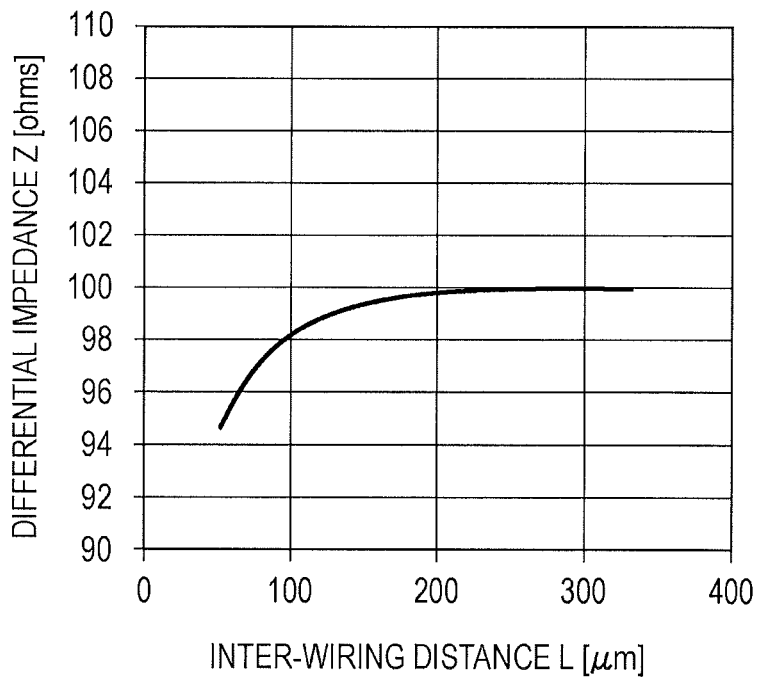
FIG. 12B is a diagram illustrating a relationship between an inter-wiring distance between the signal lines forming the differential transmission line and the differential impedance.

FIG. 12B is a diagram illustrating a relationship between the inter-wiring distance L between the pair of signal lines forming the differential transmission line and the differential impedance Z. In FIG. 12B, the widths W of the pair of signal lines are set to a fixed value or 120 μm. As illustrated in FIG. 12B, there is a tendency that as the inter-wiring distance L between the pair of signal lines is increased, the differential impedance Z increases.

In general, characteristic impedance $Z_0$ of the transmission line may be expressed according to the following Equation (1).

$$Z_0 = (L/C)^{1/2} \qquad (1)$$

In the differential transmission line, capacitance C may be adjusted by adjusting the widths W of the pair of signal lines and the inter-wiring distance L between the pair of signal lines. For example, when the widths W are increased, the capacitance C increases and the characteristic impedance $Z_0$ is reduced. When the inter-wiring distance L is reduced, the integrity between the signal lines increases, the capacitance C increases and the characteristic impedance $Z_0$ is reduced.

In each of the differential transmission lines 20 and 20A according to the first and second embodiments, the inter-wiring distances L2 between the first and second signal lines 21 and 22 in the curved region 32 are smaller than the inter-wiring distances L1 between the first and second signal lines 21 and 22 in the first and second straight regions 31 and 33. Thus, in the differential transmission line 20 according to the first embodiment in which the widths W of the first and second lines 21 and 22 are the fixed value in all the regions, the differential impedance in the curved region 32 is smaller than the differential impedance in the first and second straight regions 31 and 33. If a change point that is located on the differential transmission line and at which the differential impedance changes exists, a signal may be reflected at the change point.

As illustrated in FIG. 11, in the differential transmission line 20A according to the second embodiment, the widths W2 of the first and second signal lines 21 and 22 in the curved region 32 are smaller than the widths W1 of the first and second signal lines 21 and 22 in the first and second straight regions 31 and 33. This configuration may offset a reduction, due to the fact that the inter-wiring distances L2 in the curved region 32 are smaller than the inter-wiring distances L1 in the first and second straight regions 31 and 33, in the differential impedance. Specifically, the difference between the differential impedance in the curved region 32 and the differential impedance in the first and second straight regions 31 and 33 in the differential transmission line 20A according to the second embodiment may be smaller than the differential transmission line 20 according to the first embodiment.

Similarly to the printed board according to the first embodiment, in the printed board that includes the differential transmission line 20A according to the second embodiment, the difference between the lengths of the first and second signal lines 21 and 22 may be reduced while an increase in the area of the region occupied by the signal lines may be suppressed. In the printed board that includes the differential transmission line 20A according to the second embodiment, the difference between the differential impedance in the curved region 32 and the differential impedance in the first and second straight regions 31 and 33 may be small, and the quality of transmission may be improved. However, since the differential transmission line 20A includes the wiring portion 22e curved and extending away from the first signal line 21 on the detour path P, the inter-wiring distance between the first and second signal lines 21 and 22 in the curved region 32 is not a fixed value, and thus the differential impedance in the curved region 32 is not exactly a fixed value.

Figure 13:
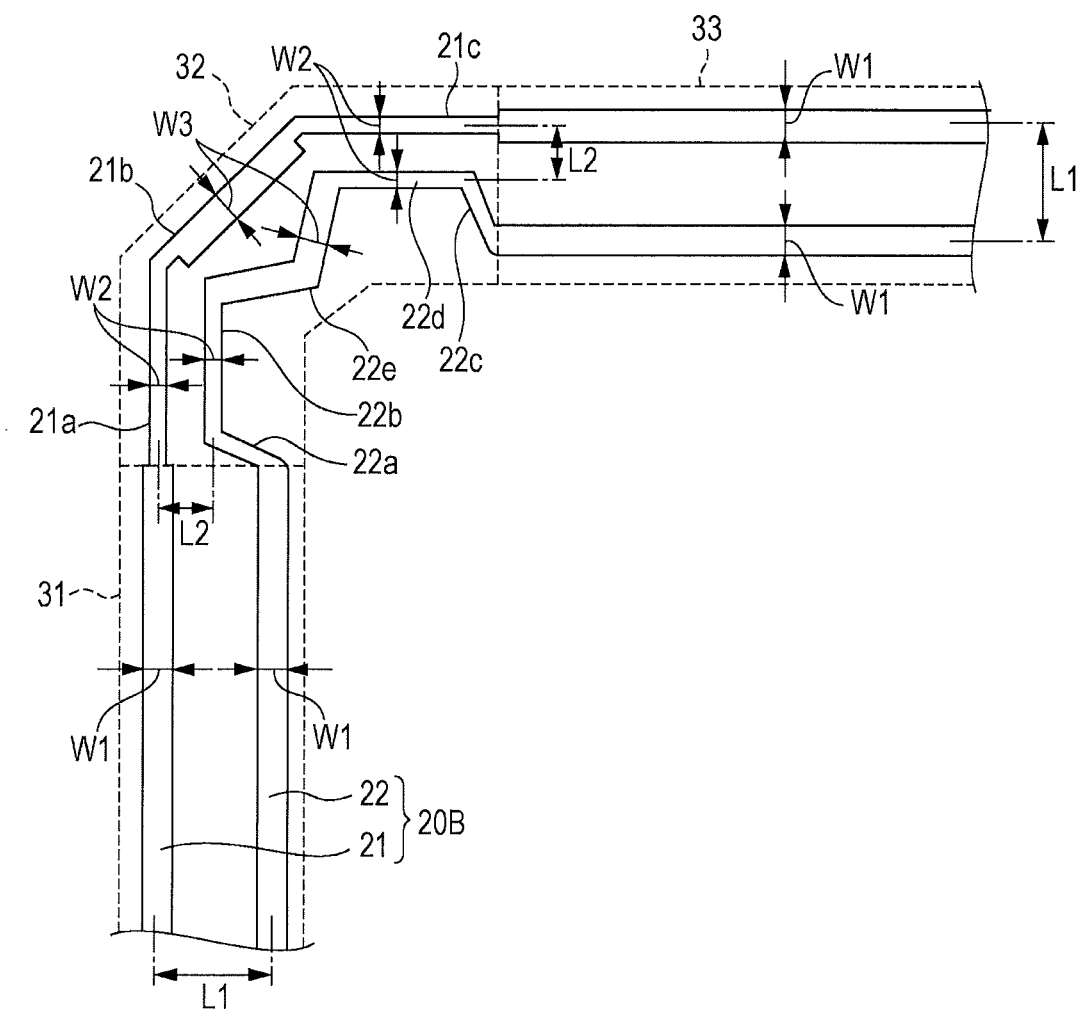
FIG. 13 is a diagram illustrating a partial wiring pattern of a differential transmission line according to a modified example of the second embodiment of the technique disclosed herein.

FIG. 13 is a diagram illustrating a partial wiring pattern of a differential transmission line 20B according to a modified example of the second embodiment of the technique disclosed herein. In FIG. 13, constituent elements that are the same as or correspond to the aforementioned differential transmission line 20 are represented by the same reference numerals and symbols as those used in the first embodiment, and a detailed description thereof is omitted.

In the differential transmission line 20B, the width W3 of the wiring portion 22e of the second signal line 22 in the curved region 32 and the width W3 of the wiring portion 21b of the first signal line 21 in the curved region 32 are larger than the widths W2 of the other wiring portions of the first and second signal lines 21 and 22 in the curved region 32. Since the widths of the wiring portions 22e and 21b between which the inter-wiring distance is larger than the inter-wiring distances between the other wiring portions in the curved region 32 are larger than the other wiring portions in the curved region 32, the unevenness of the differential impedance in the curved region 32 may be suppressed. Thus, the quality of transmission may be further improved. In the differential transmission line 20B, one of the width of the wiring portion 22e of the second signal line 22 and the width of the wiring portion 21b of the first signal line 21 may be larger than the widths of the other wiring portions.

Figure 14:
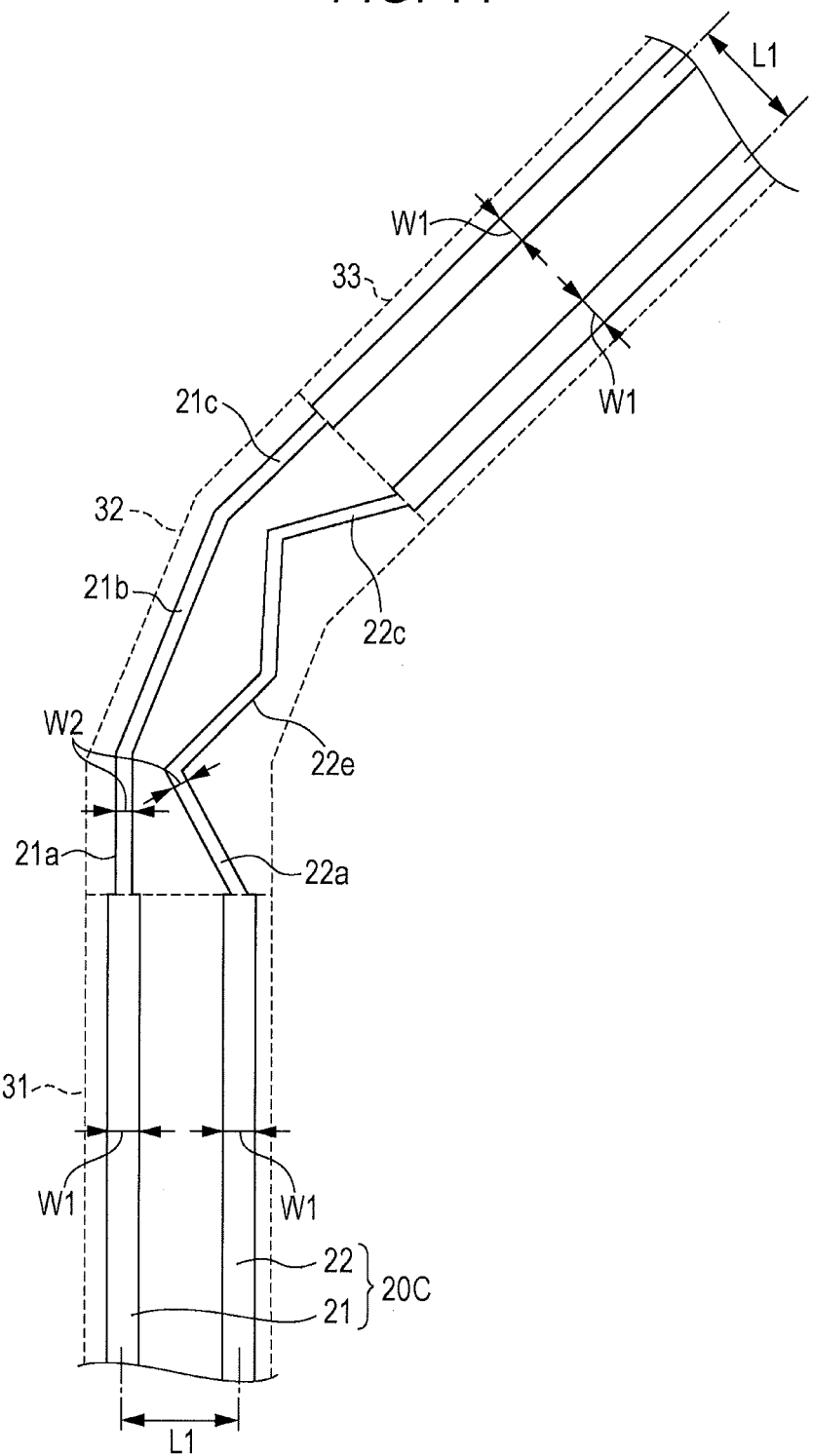
FIG. 14 is a diagram illustrating a partial wiring pattern of the differential transmission line according to a modified example of the second embodiment of the technique disclosed herein.

The technique disclosed herein is not limited to the aforementioned embodiments and may be variously modified. The first signal line 21 and the second signal line 22 are curved at the angle of 90° in the curved region 32 in the first and second embodiments, but are not limited to this. The first signal line 21 and the second signal line 22 may be curved at an arbitrary angle in the curved region. FIG. 14 is a diagram illustrating a partial wiring pattern of a differential transmission line 20C according to a modified example of the second embodiment of the technique disclosed herein. In FIG. 14, constituent elements that are the same as or correspond to the aforementioned differential transmission line 20 are represented by the same reference numerals and symbols as those used in the first embodiment, and a detailed description thereof is omitted. FIG. 14 illustrates a case where the first signal line 21 and the second signal line 22 are curved at an angle of 45° as an example. In the differential transmission line 20C, the second signal line 22 has the wiring portions 22a and 22c arranged to be circuitous and extending toward the first signal line 21 and has the wiring portion 22e curved and extending away from the first signal line 21.

In each of the aforementioned embodiments, the wiring portions of the first and second signal lines 21 and 22 extend straight and the first and second signal lines 21 and 22 are sharply curved in the curved region 32. The first and second signal lines 21 and 22, however, are not limited to this. The first and second signal lines 21 and 22 may be smoothly curved in the curved region 32.

In addition, although the differential transmission lines 20, 20A, 20B, and 20C according to the aforementioned embodiments that each include the first straight region 31, the curved region 32, and the second straight region 33 are described above, the technique disclosed herein is not limited to them. Each of the differential transmission lines 20, 20A, 20B, and 20C may include only the curved region or may include the curved region and a straight region connected to only one of both ends of the curved region.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed board comprising:
a transmission line that includes a curved region in which a first signal line and a second signal line are arranged separately from each other and curved,
wherein the second signal line is arranged on an inner side of the curved region with respect to the first signal line in the curved region and has a portion extending away from the first signal line on a path arranged to be circuitous and extending partially toward the first signal line in the curved region,
wherein the transmission line further includes a straight region that is located adjacent to the curved region and in which the first signal line and the second signal line extend straight,
wherein the width of the first signal line and the width of the second signal line in the curved region are smaller than the width of the first signal line and the width of the second signal line in the straight region,
wherein the second signal line has a first wiring portion curved and extending toward the first signal line from one of ends of the curved region, a second wiring portion curved and extending toward the first signal line from the other end of the curved region, and a third wiring portion located between the first wiring portion and the second wiring portion and curved and extending away from the first signal line, and
wherein the width of the third wiring portion is larger than the width of the first wiring portion and the width of the second wiring portion.

2. The printed board according to claim 1,
wherein the transmission line further includes a first straight region that is located adjacent to one of ends of the curved region and in which the first signal line and the second signal line extend straight in a first direction and a second straight region that is located adjacent to the other end of the curved region and in which the first signal line and the second signal line extend straight in a second direction that is different from the first direction, and
wherein the width of the first signal line and the width of the second signal line in the curved region are smaller than the width of the first signal line and the width of the second signal line in the first straight region and the second straight region.

3. The printed board according to claim 1,
wherein the third wiring portion extends through a point at which a distance between the third wiring portion and the first signal line is larger than a minimum distance between the first wiring portion and the first signal line and a minimum distance between the second wiring portion and the first signal line.

4. The printed board according to claim 1, further comprising:
a dielectric layer in which the first signal line and the second signal line are formed; and
conductive films covering top and bottom surfaces of the dielectric layer.

5. A wiring arrangement method comprising:
a process of arranging a wiring portion of a first signal line in a curved region so as to ensure that the wiring portion of the first signal line is curved in a predetermined direction;
a process of arranging a wiring portion of a second signal line, curved along the first signal line, in the curved region on the same side toward which the region is curved with respect to the first signal line;
a process of arranging a first wiring portion of the second signal line in the curved region so as to ensure that the first wiring portion of the second signal line is curved and extends toward the first signal line from one of ends of the curved region;

a process of arranging a second wiring portion of the second signal line in the curved region so as to ensure that the second wiring portion of the second signal line is curved and extends toward the first signal line from the other end of the curved region;

a process of arranging a third wiring portion of the second signal line in the curved region so as to ensure that the third wiring portion of the second signal line is located between the first wiring portion and the second wiring portion and curved and extends away from the first signal line;

a process of arranging a wiring portion of the first signal line in a straight region located adjacent to the curved region so as to ensure that the wiring portion of the first signal line extends straight in the straight region; and a process of arranging a wiring portion of the second signal line in the straight region so as to ensure that the wiring portion of the second signal line extends in parallel to the first signal line, wherein the width of the first signal line and the width of the second signal line in the curved region are smaller than the width of the first signal line and the width of the second signal line in the straight region, and wherein the width of the third wiring portion is larger than the width of the first wiring portion and the width of the second wiring portion.

6. The wiring arrangement method according to claim 5, further comprising:

a process of calculating the difference between the length of the first signal line and the length of the second signal line;

a process of determining whether or not the difference between the lengths is in an acceptable range; and a process of rearranging the third wiring portion when the difference between the lengths is not in the acceptable range.

7. The wiring arrangement method according to claim 6, wherein the third wiring portion includes, as a folding point, a point at which a distance between the third wiring portion and the first signal line is larger than a minimum distance between the first wiring portion and the first signal line and a minimum distance between the second wiring portion and the first signal line, and wherein the position of the folding point is moved to be closer to or farther from the first signal line in the process of rearranging the third wiring portion when the difference between the lengths is not in the acceptable range.

* * * * *